(12) United States Patent
Han et al.

(10) Patent No.: US 12,016,205 B2
(45) Date of Patent: Jun. 18, 2024

(54) MANUFACTURING METHOD FOR DISPLAY PANEL, DISPLAY PANEL AND DISPLAY DEVICE

(71) Applicant: BOE Technology Group Co., Ltd., Beijing (CN)

(72) Inventors: Cheng Han, Beijing (CN); Xin Li, Beijing (CN); Xing Fan, Beijing (CN); Songquan Wu, Beijing (CN); Meng Sun, Beijing (CN); Erli Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 429 days.

(21) Appl. No.: 17/458,193

(22) Filed: Aug. 26, 2021

(65) Prior Publication Data

US 2022/0123057 A1    Apr. 21, 2022

(30) Foreign Application Priority Data

Oct. 15, 2020  (CN) .......................... 202011105959.3

(51) Int. Cl.
*H10K 71/00* (2023.01)
*H10K 59/121* (2023.01)
*H10K 59/12* (2023.01)

(52) U.S. Cl.
CPC ........... *H10K 59/121* (2023.02); *H10K 71/00* (2023.02); *H10K 59/1201* (2023.02)

(58) Field of Classification Search
CPC .............................. H10K 59/121; H10K 71/00
See application file for complete search history.

(56) References Cited

U.S. PATENT DOCUMENTS

2014/0151651 A1*  6/2014  Jin ...................... H10K 59/122
                                                          438/23
2019/0006557 A1*  1/2019  Kim ...................... H01L 33/20

FOREIGN PATENT DOCUMENTS

CN          110246884 A        9/2019
CN          111554715 A        8/2020
                    (Continued)

OTHER PUBLICATIONS

CN2020111059593 first office action.

*Primary Examiner* — Douglas M Menz
(74) *Attorney, Agent, or Firm* — IPro, PLLC

(57) ABSTRACT

The application provides a manufacturing method for a display panel, a display panel, and a display device. The manufacturing method includes: providing a substrate; forming a driving circuit layer on the substrate; forming a planarization layer on the side of the driving circuit layer facing away from the substrate; forming a composite material layer on the side of the planarization layer facing away from the substrate with a polymerization-induced phase separation method to the composite material layer including a polymer and liquid crystal phase molecules dispersed in the polymer; removing the liquid crystal phase molecules in the composite material layer to obtain an auxiliary structure layer, the side of the auxiliary structure layer facing away from the substrate having a plurality of protrusion structures; and forming a pixel structure on the side of the auxiliary structure layer facing away from the substrate, wherein the auxiliary structure layer makes the pixel structure uneven, and the pixel structure includes a first electrode, an organic light emitting material, and a second electrode that are sequentially formed on the side of the auxiliary structure layer facing away from the substrate.

18 Claims, 6 Drawing Sheets

(56) References Cited

FOREIGN PATENT DOCUMENTS

| KR | 20080104715 A | 12/2008 |
|----|---------------|---------|
| KR | 20140028774 A | 3/2014  |
| KR | 20150078901 A | 7/2015  |

* cited by examiner

MANUFACTURING METHOD FOR DISPLAY PANEL, DISPLAY PANEL AND DISPLAY DEVICE

CROSS-REFERENCES TO RELATED APPLICATIONS

This patent application claims the priority of a Chinese patent application No. 2020111059593, filed on Oct. 15, 2020, and entitle "MANUFACTURING METHOD FOR DISPLAY PANEL", the entire content of which is hereby incorporated by reference for all purposes.

TECHNICAL FIELD

This application relates to the field of display technology, and in particular to a manufacturing method for a display panel, a display panel, and a display device.

BACKGROUND

OLED (Organic Light emitting Diode) has advantages of wide viewing angle, fast response, high contrast, among others, and has been widely used in display devices.

The OLED display device is limited by a high refractive index film layer inside, and its light extraction rate is only about 20%, and about 80% of the light is restricted inside the device and eventually absorbed. Therefore, improving the light extraction rate of OLED display devices is a research hotspot in the field of displays.

SUMMARY

The embodiments of the present application provide a method for manufacturing a display panel, a display panel, and a display device. The manufacturing method includes:
 providing a substrate;
 forming a driving circuit layer on the substrate;
 forming a planarization layer on the side of the driving circuit layer facing away from the substrate;
 forming a composite material layer on the side of the planarization layer facing away from the substrate with a polymerization-induced phase separation method to the composite material layer including a polymer and liquid crystal phase molecules dispersed in the polymer;
 removing the liquid crystal phase molecules in the composite material layer to obtain an auxiliary structure layer, the side of the auxiliary structure layer facing away from the substrate having a plurality of protrusion structures; and
 forming a pixel structure on the side of the auxiliary structure layer facing away from the substrate, wherein the auxiliary structure layer makes the pixel structure uneven, and the pixel structure includes a first electrode, an organic light emitting material, and a second electrode that are sequentially formed on the side of the auxiliary structure layer facing away from the substrate.

In one implementation, forming a composite material layer on the side of the planarization layer facing away from the substrate with a polymerization-induced phase separation method includes:
 coating a mixture of liquid crystal phase molecules and polymer monomers on the planarization layer; and
 initiating a polymerization reaction of the polymer monomers, to generate a plurality of microsphere structures of a material of polymer, wherein the liquid crystal phase molecules are dispersed in gaps among the microsphere structures to obtain the composite material layer including the plurality of microsphere structures and the liquid crystal phase molecules.

In one implementation, the polymer monomers are ultraviolet polymer monomers, and initiating a polymerization reaction of the polymer monomers, to generate a plurality of microsphere structures of a material of polymer includes:
 irradiating the mixture with ultraviolet light to polymerize the ultraviolet polymer monomers to form a plurality of microsphere structures.

In one implementation, the polymer monomers are thermally polymer monomers, and initiating a polymerization reaction of the polymer monomers, to generate a plurality of microsphere structures of a material of polymer includes:
 heating the mixture to polymerize the thermally polymer monomers to form a plurality of microsphere structures.

In one implementation, in the mixture of the liquid crystal phase molecules and the polymer monomers, a mass fraction of the liquid crystal phase molecules is in the range of 50%~80%.

In one implementation, the auxiliary structure layer includes a plurality of microsphere structures, and a size of the microsphere structure ranges from 100 nm to 2000 nm.

In one implementation, in the auxiliary structure layer, the maximum thickness of the protrusion structure ranges from 20 nm to 400 nm.

In one implementation, the liquid crystal phase molecules are liquid crystal molecules.

In one implementation, the liquid crystal phase molecules are made of organic material, and removing the liquid crystal phase molecules in the composite material layer includes:
 immersing the composite material layer in an organic solvent, or spraying the composite material layer with an organic solvent, so that the liquid crystal phase molecules are dissolved in the organic solvent.

In one implementation, the first electrode is a reflective electrode, and the second electrode is a light transmitting electrode; or, the first electrode is a light transmitting electrode, and the second electrode is a reflective electrode.

The present application also provides a display panel including:
 a substrate;
 a driver circuit layer over the substrate e;
 a planarization layer on the side of the driver circuit facing away from the substrate;
 an auxiliary structure layer on the side of the planarization layer facing away from the substrate, the auxiliary structure layer having a plurality of protrusion structures on the side of the auxiliary structure layer facing away from the substrate; and
 a pixel structure on the side of the auxiliary structure layer facing away from the substrate, wherein the auxiliary structure layer makes the pixel structure uneven, and the pixel structure includes a first electrode, an organic light emitting material, and a second electrode that are sequentially formed on the side of the auxiliary structure layer facing away from the substrate.

In one implementation, the auxiliary structure layer is formed by polymerizing polymer monomers to form a plurality of microsphere structures, filling the gaps among the microsphere structures with liquid crystal phase molecules to form protrusion structures, and finally removing the liquid crystal phase molecules.

In one implementation, the material of the auxiliary structure layer is at least one of an olefin monomer and a mercaptan monomer or at least one of an epoxy monomer and a thiol monomer.

In one implementation, the auxiliary structure layer includes a plurality of microsphere structures, and the plurality of microsphere structures are gathered together to form at least one microsphere aggregation layer, and the exposed part of the uppermost microsphere aggregation layer forms the plurality of protrusion structures.

In one implementation, the size of the microsphere structure ranges from 100 nm to 2000 nm.

In one implementation, the protrusion structure is hemispherical.

In one implementation, the maximum thickness of the protrusion structures ranges from 20 nm to 400 nm.

The present application also provides a display device including:
- a display panel of claim 11; and
- a housing, wherein the display panel is embedded in the housing.

The main technical effects achieved by the embodiments of this application are as follows.

In the manufacturing method for display panel provided by the embodiment of the application, a polymerization-induced phase separation method is used to form a composite material layer on the side of the planarization layer facing away from the substrate, and then the liquid crystal phase molecules are removed in the composite material layer to obtain a plurality of protrusion structure. The auxiliary structure layer of the structure makes the pixel structure formed on the auxiliary structure layer uneven, which can change the angle of incidence of light entering each film layer, reduce the amount of light that is totally reflected, reduce the light loss caused by the waveguide mode and increase the amount of light emitted. The unevenness of the first electrode and the second electrode of the pixel structure can reduce the light loss of the surface plasma mode near the electrode, and further increase the amount of light emitted. Moreover, the unevenness of the pixel structure can also improve the uniformity of light in different light directions, alleviate the problem of fast brightness decay under large viewing angles and color shifts under different viewing angles caused by the microcavity effect. Compared with the method of producing protrusion structures on the planarization layer by template imprinting technology, the manufacturing method provided in the present application can have more refined protrusion structures, is more suitable for display panels with smaller pixel structure sizes, and the manufacturing process is simpler and easier to implement.

DETAILED DESCRIPTION OF THE EMBODIMENTS

Figure 1:
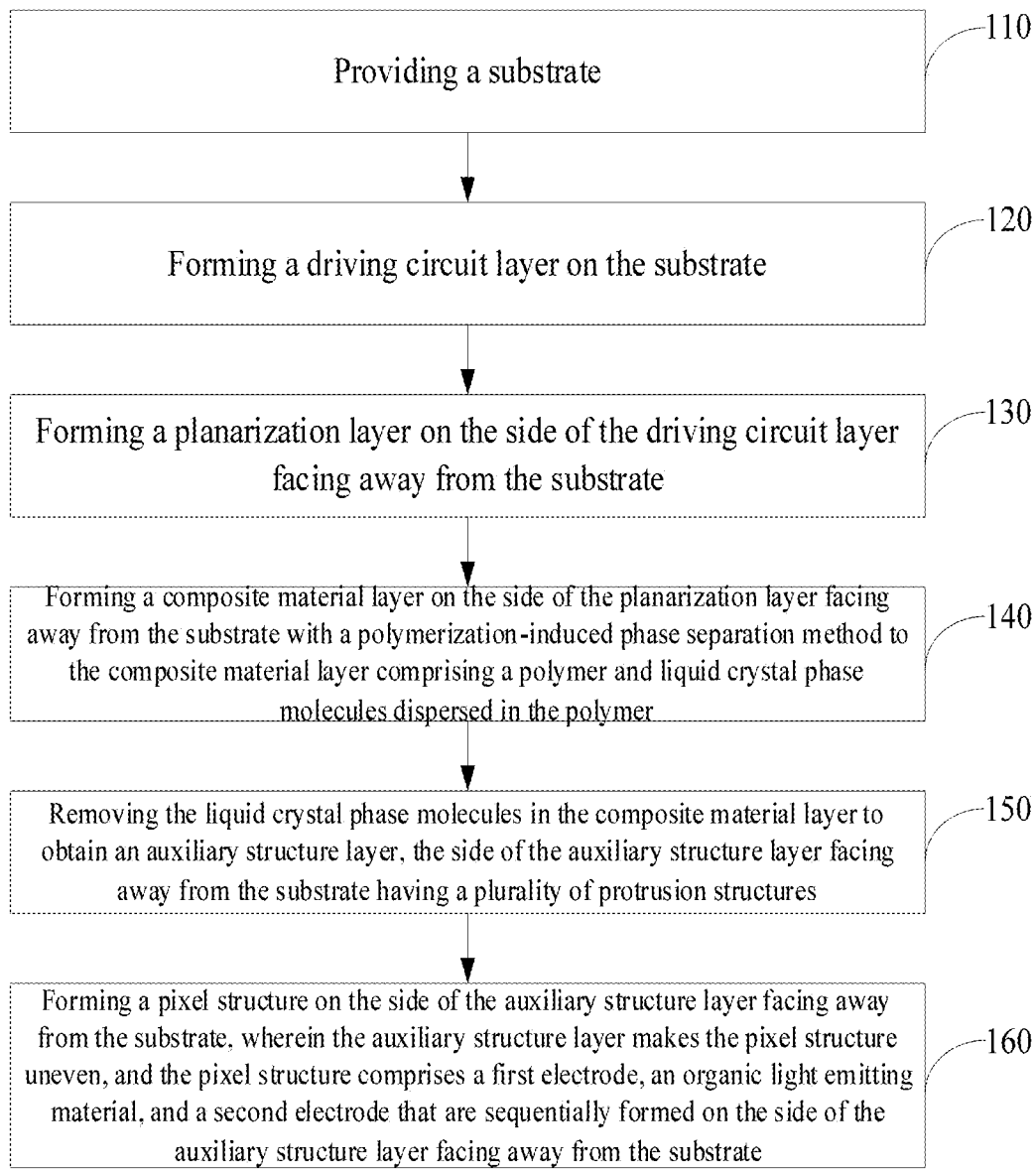
FIG. 1 is a flowchart of a manufacturing method of a display panel provided by an exemplary embodiment of the present application.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein is and includes any and all possible combinations of one or more of the associated listed items.

It is to be understood that, although terms "first," "second," "third," and the like may be used in the present disclosure to describe various information, such information should not be limited to these terms. These terms are only used to distinguish one category of information from another. For example, without departing from the scope of the present disclosure, first information may be referred as second information; and similarly, second information may also be referred as first information. Depending on the context, the word "if" as used herein may be interpreted as "when" or "upon" or "in response to determining" The embodiment of the present application provides a manufacturing method for a display panel. The manufacturing method for a display panel in the embodiment of the present application will be described in detail below with reference to the accompanying drawings. The features in the following embodiment can be mutually supplemented or combined with one another without conflict.

The embodiment of the present application provides a method for manufacturing a display panel. The manufacturing process of the display panel will be introduced below. The term "patterning process" referred to in the embodiments of the present application includes processes such as depositing a film layer, coating photoresist, mask exposure, developing, etching, and stripping photoresist. The deposition can be any one or more selected from sputtering, evaporation and chemical vapor deposition, and the etching can be any one or more selected from dry etching and wet etching. The term "thin film" refers to a layer of film made by depositing or coating a certain material on a substrate. If the "thin film" does not require a patterning process during the entire production process, the "thin film" can also be referred to as a "layer". When the "thin film" needs a patterning process during the entire production process, it is called a "thin film" before the patterning process, and it can be called a "layer" after the patterning process. The "layer" after the patterning process contains at least one "pattern".

Referring to FIG. 1, the manufacturing method for display panel includes the following steps 110 to 160.

In step 110, a substrate is provided.

In step 120, a driver circuit layer is formed on the substrate.

In step 130, a planarization layer is formed on the side of the driving circuit layer facing away from the substrate.

In step 140, a composite material layer is formed on the side of the planarization layer facing away from the substrate with a polymerization-induced phase separation method, and the composite material layer includes a polymer and liquid crystal phase molecules dispersed in the polymer.

In step 150, the liquid crystal phase molecules in the composite material layer are removed to obtain an auxiliary structure layer, and the side of the auxiliary structure layer facing away from the substrate has a plurality of protrusion structures.

In step 160, a pixel structure is formed on the side of the auxiliary structure layer facing away from the substrate, the auxiliary structure layer makes the pixel structure uneven, and the pixel structure includes a first electrode, an organic light emitting material, and a second electrode that are sequentially formed on the side of the auxiliary structure layer facing away from the substrate.

In the manufacturing method for display panel provided by the embodiment of the application, a polymerization-induced phase separation method is used to form a composite material layer on the side of the planarization layer facing away from the substrate, and then the liquid crystal phase molecules are removed in the composite material layer to obtain a plurality of protrusion structure. The auxiliary structure layer of the structure makes the pixel structure formed on the auxiliary structure layer uneven, which can change the angle of incidence of light entering each film layer, reduce the amount of light that is totally reflected, reduce the light loss caused by the waveguide mode and increase the amount of light emitted. The unevenness of the first electrode and the second electrode of the pixel structure can reduce the light loss of the surface plasma mode near the electrode, and further increase the amount of light emitted. Moreover, the unevenness of the pixel structure can also improve the uniformity of light in different light directions, alleviate the problem of fast brightness decay under large viewing angles and color shifts under different viewing angles caused by the microcavity effect. Compared with the method of producing protrusion structures on the planarization layer by template imprinting technology, the manufacturing method provided in the present application can have more refined protrusion structures, is more suitable for display panels with smaller pixel structure sizes, and the manufacturing process is simpler and easier to implement.

Hereinafter, each step of the manufacturing method for a display panel provided by the embodiment of the present application will be described in detail.

In step 110, a substrate is provided.

In one implementation, the substrate is a flexible substrate, and the material of the flexible substrate can be one or more of PET (polyethylene terephthalate), PI (polyimide), and PC (polycarbonate). In other implementations, the substrate is a rigid substrate, and the material of the rigid substrate can be glass, metal, or the like.

In step 120, a driver circuit layer is formed on the substrate.

Figure 2:
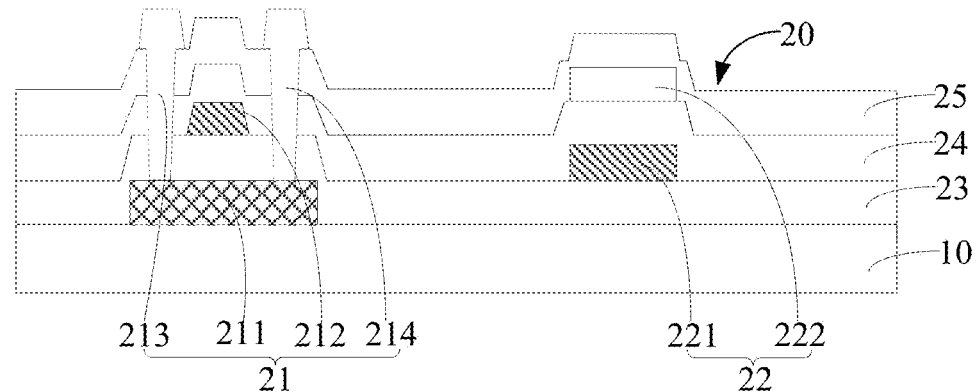
FIG. 2 is a schematic structural diagram of a first intermediate structure of a display panel provided by an exemplary embodiment of the present application.

After step 120, a first intermediate structure as shown in FIG. 2 can be obtained.

Referring to FIG. 2, the driving circuit layer 20 is formed on the substrate 10, and the driving circuit layer 20 includes a plurality of pixel driving circuits. The pixel driving circuit is used to drive the sub-pixels of the pixel structure of the display panel to emit light, and the pixel driving circuit includes a thin film transistor 21 and a capacitor 22. The thin film transistor 21 includes an active layer 211, a gate electrode 212, a source electrode 213, and a drain electrode 214. The capacitor 22 includes a first electrode plate 221 and a second electrode plate 222.

In one implementation, the step 120 of forming a driving circuit layer on the substrate can include the following processes.

First, an active layer thin film is deposited on the substrate 10, and the active layer thin film is patterned through a patterning process to form the active layer 211.

Subsequently, a gate insulating layer 23 and a first metal thin film are sequentially deposited, and the first metal thin film is patterned through a patterning process to form the gate electrode 212 and the first electrode plate 221.

Subsequently, a capacitor insulating layer 24 and a second metal thin film are sequentially deposited, and the second metal thin film is patterned through a patterning process to form the second electrode plate 222. The second electrode plate 222 corresponds to the position of the first electrode plate 221 in the stacking direction of the film layers.

Subsequently, an interlayer dielectric layer 25 is deposited in turn, and the gate insulating layer 23, the capacitor insulating layer 24, and the interlayer dielectric layer 25 are etched to form a via hole penetrating the gate insulating layer 23, the capacitor insulating layer 24, and the interlayer dielectric layer 25. A plurality of via holes are formed on the active layer 211 correspondingly.

Subsequently, a third metal thin film is deposited in turn, and the third metal thin film is patterned through a patterning process to form the source electrode 213 and the drain electrode 214. The source electrode 213 and the drain electrode 214 are electrically connected to the active layer 211 through via holes, respectively. The third metal thin film can include two metal titanium film layers and a metal aluminum film layer located between the two metal titanium film layers.

In step 130, a planarization layer is formed on the side of the driving circuit layer facing away from the substrate.

Figure 3:
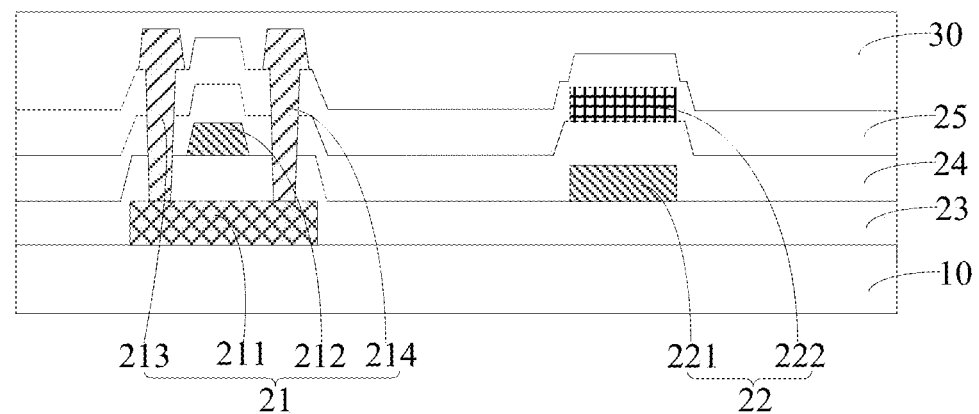
FIG. 3 is a schematic structural diagram of a second intermediate structure of a display panel provided by an exemplary embodiment of the present application.

After step 130, a second intermediate structure as shown in FIG. 3 can be obtained.

Referring to FIG. 3, the planarization layer 30 covers the side of the driving circuit layer 20 facing away from the substrate 10, and the side of the planarization layer 30 facing away from the substrate 10 is flush everywhere, so as to facilitate subsequently forming other films on the side of the planarization layer 30 facing away from the substrate 10.

In step 140, a composite material layer is formed on the side of the planarization layer facing away from the substrate with a polymerization-induced phase separation method, and the composite material layer includes a polymer and liquid crystal phase molecules dispersed in the polymer.

In one implementation, the step 140 of forming a composite material layer on the side of the planarization layer facing away from the substrate by using a polymerization-induced phase separation method can be implemented by the following process.

First, a mixture of liquid crystal phase molecules and polymer monomers is coated on the planarization layer.

Figure 4:
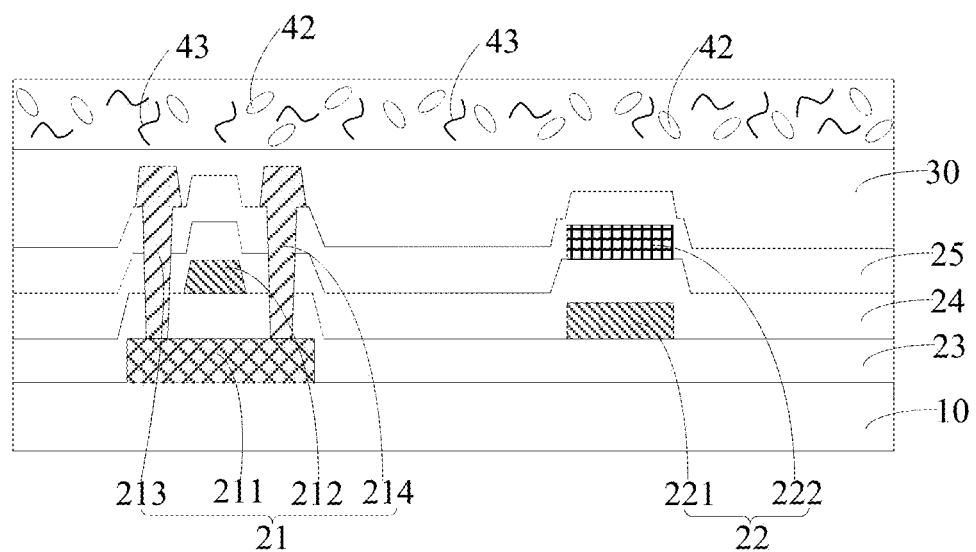
FIG. 4 is a schematic structural diagram of a third intermediate structure of a display panel provided by an exemplary embodiment of the present application.

After this step, a third intermediate structure as shown in FIG. 4 can be obtained. Referring to FIG. 4, the liquid crystal phase molecules 42 are uniformly dispersed among the polymer monomers 43.

Before this step, the liquid crystal phase molecules 42 and the polymer monomers 43 can be uniformly mixed, and then the mixture can be coated on the planarization layer 30. The liquid crystal phase molecules and the polymer monomers are uniformly mixed, so that the distribution of the protrusion structures of the auxiliary structure layer formed in the subsequent step 150 can be more uniform, and it is more helpful to improve the uniformity of light emission of the panel in actual application.

Subsequently, a polymerization reaction of the polymer monomers is initiated to generate a plurality of microsphere structures of a material of polymer, and the liquid crystal phase molecules are dispersed in the gaps among the microsphere structures to obtain a structure including a composite material layer of the plurality of microsphere structures and the liquid crystal phase molecules.

The polymer monomers are cured to form a polymer after polymerization. The polymer has a structure of a plurality of microsphere structures. The liquid crystal phase molecules are in an orderly fluid state between a liquid state and a crystalline state. The liquid crystal phase molecules are uniformly dispersed in the gaps among the microsphere particles.

Figure 5:
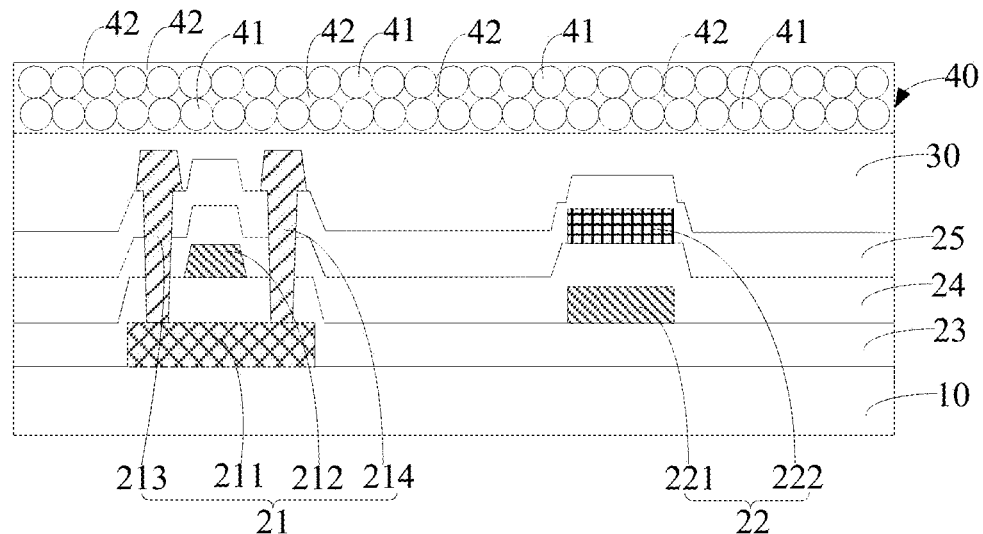
FIG. 5 is a schematic structural diagram of a fourth intermediate structure of a display panel provided by an exemplary embodiment of the present application.

After this step, a fourth intermediate structure as shown in FIG. 5 can be obtained. Referring to FIG. 5, a composite material layer 40 is formed on the side of the planarization layer 30 facing away from the substrate 10, and the composite material layer 40 includes a polymer 41 and liquid crystal phase molecules 42 dispersed in the polymer 41. The polymer 41 has microsphere structures, and the gaps among the microsphere structures are filled with liquid crystal phase molecules 42.

In an example, the polymer monomers are ultraviolet polymer monomers, and the step of initiating polymerization of the polymer monomers to generate a polymer of a plurality of microsphere structures includes the following process:

irradiating the mixture with ultraviolet light to polymerize the ultraviolet polymer monomers to form a plurality of microsphere structures.

The irradiation of ultraviolet light initiates the polymerization of the ultraviolet polymer monomers, and the ultraviolet polymer monomers are polymerized and cured to form a polymer. Controlling the ultraviolet light to irradiate can initiate polymerization of the ultraviolet polymer monomers, the formation process of the composite material layer 40 is relatively well controlled, and the operation is simple.

In some examples, the material of the ultraviolet polymer monomers can be at least one of an olefin monomer and a mercaptan monomer, or other ultraviolet polymer monomers can also be used.

In another example, the polymer monomers are thermally polymer monomers, and initiating the polymerization reaction of the polymer monomers to generate a plurality of microsphere structures of a material of polymer, includes:

heating the mixture to polymerize the thermally polymer monomers to form a polymer of a plurality of microsphere structures.

Heating the mixture of the thermally polymer monomers and the liquid crystal phase molecule initiates the polymerization of the thermally polymer monomer, and the thermally polymer monomer is polymerized and cured to form a polymer. Heating the mixture can initiate the polymerization of the thermal polymer monomer, the formation process of the composite material layer 40 is relatively well controlled, and the operation is simple.

In some embodiments, the thermally polymer monomers can be at least one of epoxy monomer and thiol monomer. Alternatively, other thermally polymer monomers can also be used.

In one example, the liquid crystal phase molecules are liquid crystal molecules. Liquid crystal molecular materials are readily available. The liquid crystal molecules can be nematic liquid crystals, smectic liquid crystals, cholesteric liquid crystals, and the like.

In one example, in the mixture of the liquid crystal phase molecules and the polymer monomers, the mass fraction of the liquid crystal phase molecules is in the range of 50%~80%, and the mass fraction of the polymer monomers is in the range of 20%~50%. This arrangement can prevent the mass of the liquid crystal phase molecules from being too large, causing the resulting protrusion structures of the auxiliary structure layer to be too undulating, and causing the first electrode, the organic light emitting material, and the second electrode subsequently formed to be broken. Also, it can prevent that the mass fraction of the liquid crystal phase molecules is too small, resulting in too small undulations of the protrusion structures of the auxiliary structure layer formed subsequently, which cannot effectively improve the light extraction efficiency of the display panel, and cannot effectively alleviate the problem of fast brightness decay under large viewing angles and color shifts under different viewing angles. The mass fraction of liquid crystal phase molecules in the mixture of liquid crystal phase molecules and polymer monomers is, for example, 50%, 60%, 70%, 80%, and so on.

In step 150, the liquid crystal phase molecules in the composite material layer are removed to obtain an auxiliary structure layer, and the side of the auxiliary structure layer facing away from the substrate has a plurality of protrusion structures.

Figure 6:
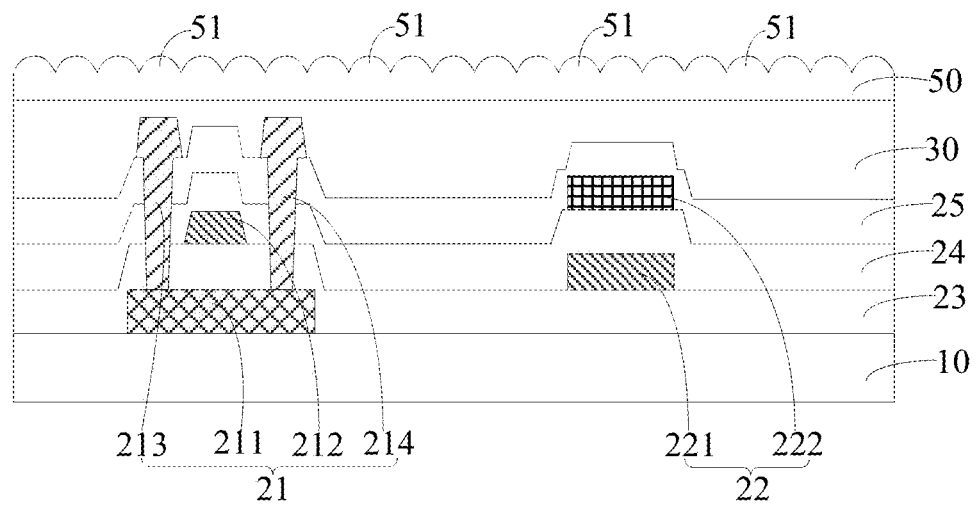
FIG. 6 is a schematic structural diagram of a fifth intermediate structure of a display panel provided by an exemplary embodiment of the present application.

After step 150, a fifth intermediate structure as shown in FIG. 6 can be obtained. Referring to FIG. 6, the surface of the auxiliary structure layer 50 facing away from the substrate has a plurality of protrusion structures 51. That is, the surface of the auxiliary structure layer 50 facing away from the substrate is uneven.

Figure 7:
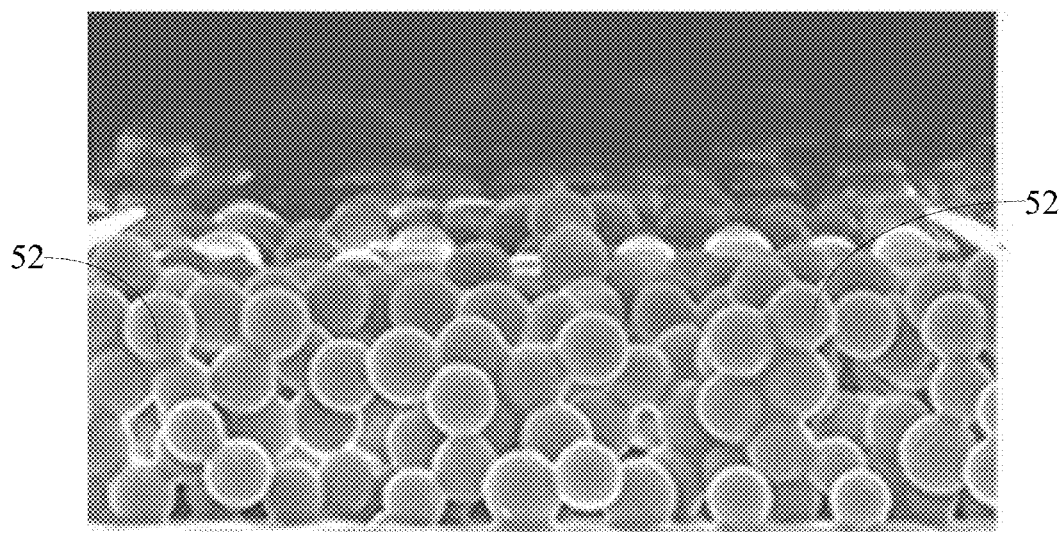
FIG. 7 is a scanning electron microscope diagram of an auxiliary structure layer of a display panel provided by an exemplary embodiment of the present application.

Referring to FIG. 7, after removing the liquid crystal phase molecules in the composite material layer 40, the resulting auxiliary structure layer 50 includes a plurality of microsphere structures 52, and the plurality of microsphere structures 52 are gathered together to form at least one microsphere aggregation layer. The exposed part of the uppermost microsphere aggregation layer is the protrusion structures 51. The protrusion structures 51 can have a hemispherical shape.

In one example, the size of the microsphere structure 52 ranges from 100 nm to 2000 nm. The larger the size of the microsphere structure 52 is, the greater the undulation of the protrusion structures 51 of the auxiliary structure layer 50 will be. By setting the size of the microsphere structure 52 in the range of 100 nm to 2000 nm, it can be avoided that the size of the microsphere structure 52 is too large to cause excessive undulations on the side of the auxiliary structure layer 50 facing away from the substrate 10, and causing the subsequently formed film layer of the pixel structure to be broken. Also, it can prevent that the size of the microsphere structure 52 is too small to make the side of the auxiliary structure layer 50 facing away from the substrate 10 have too small undulations, resulting in too small undulations of the film layer of the pixel structure formed subsequently, which cannot effectively improve the light extraction efficiency, and cannot effectively alleviate the problem of fast brightness decay under large viewing angles and color shifts under different viewing angles. When the microsphere structure 52 is spherical, the size of the microsphere structure 52 refers to the diameter of the microsphere structure. When the microsphere structure 52 is non-spherical, the size of the microsphere structure 52 refers to the size at the position with the largest size.

In one example, in the auxiliary structure layer, the maximum thickness of the protrusion structures 51 ranges from 20 nm to 400 nm. This arrangement can prevent the thickness of the protrusion structure 51 from being too large to cause the subsequently formed film layer of the pixel structure to be broken. Also, it can prevent the thickness of the protrusion structure 51 from being small, which cannot effectively change the incident angle of each film layer, which cannot effectively increase the amount of light emitted by the display panel, and cannot effectively alleviate the problem of fast brightness decay under large viewing angles and color shifts under different viewing angles. The maximum thickness of the protrusion structure 51 can be 20 nm, 40 nm, 80 nm, 120 nm, 160 nm, 200 nm, 300 nm, 400 nm, and so on, for example.

In one example, the material of the liquid crystal phase molecules is an organic material, and the step 150 of removing the liquid crystal phase molecules in the composite material layer to obtain an auxiliary structure layer can include the following processes:

immersing the composite material layer in an organic solvent, or the composite material layer is sprayed with an organic solvent, so that the liquid crystal phase molecules are dissolved in the organic solvent.

Since the liquid crystal phase molecules are organic materials and the liquid crystal phase molecules are in an orderly fluid state, when the composite material layer 40 is immersed in an organic solvent or the composite material layer is sprayed with an organic solvent, the liquid crystal phase molecules are easily separated from the microsphere structures and dissolved in the organic solvent. The use of organic solvent can make the removal of liquid crystal phase molecules in the gaps of the microsphere structures relatively complete.

In some examples, the liquid crystal phase molecules include liquid crystal molecules, and the organic solvent includes at least one of cyclohexane and acetone. The solubility of liquid crystal molecules in cyclohexane and acetone is greater, which is more conducive to the removal of liquid crystal molecules.

In step 160, a pixel structure is formed on the side of the auxiliary structure layer facing away from the substrate, the auxiliary structure layer makes the pixel structure uneven, and the pixel structure includes a first electrode, an organic light emitting material, and a second electrode that are sequentially formed on the side of the auxiliary structure layer facing away from the substrate.

Figure 8:
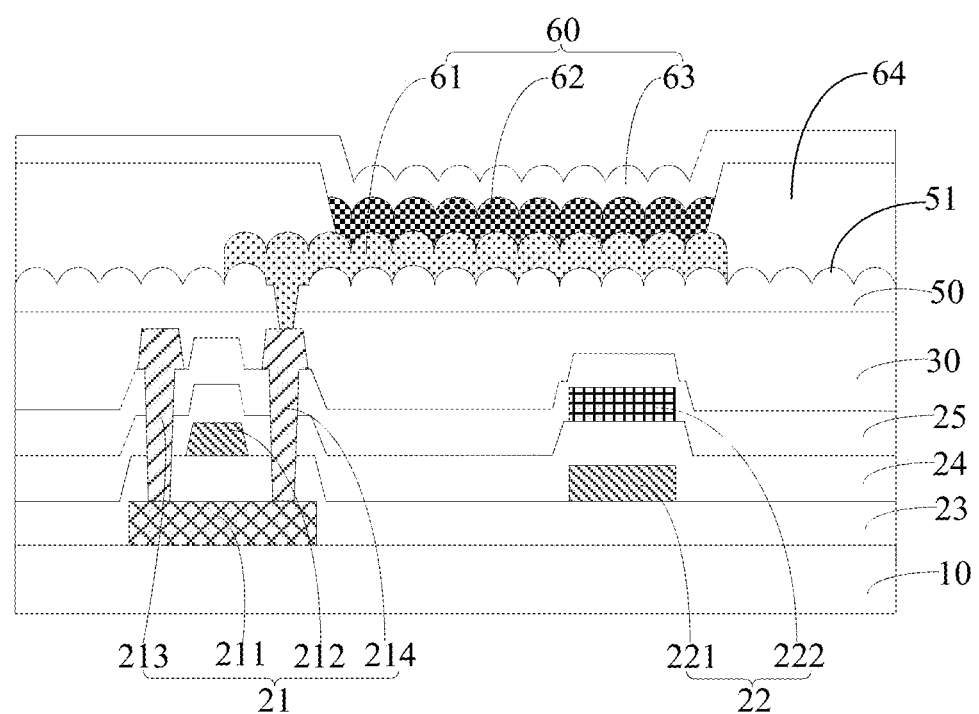
FIG. 8 is a schematic structural diagram of a display panel provided by an exemplary embodiment of the present application.

After step 160, a display panel as shown in FIG. 8 can be obtained. Referring to FIG. 8, the first electrode 61, the organic light emitting material 62 and the second electrode 63 of the pixel structure 60 are all uneven. The positions of the protrusions of the first electrode 61, the organic light emitting material 62, and the second electrode 63 correspond to the positions of the protrusion structures 51 of the auxiliary structure layer 50 in the stacking direction of the display panel. The size of the protrusion of the first electrode 61, the organic light emitting material 62 and the second electrode 63 is approximately the same as the size of the protrusion structure 51 of the auxiliary structure layer 50.

In one example, the step 160 of forming a pixel structure on the side of the auxiliary structure layer facing away from the substrate can include the following processes.

First, a first electrode film is formed on the side of the auxiliary structure layer 50 facing away from the substrate 10, and the first electrode film is patterned through a patterning process to form a plurality of first electrodes 61. The first electrodes 61 are electrically connected to the drain electrodes 214 through via holes penetrating the planarization layer 30 and the auxiliary structure layer 50. The first electrode 61 is formed on the auxiliary structure layer 50, and the first electrode 61 is protruded at the position corresponding to the protrusion structure 51, and recessed at the position corresponding to the concave between adjacent protrusion structures 51, so the whole structure of the first electrodes 61 is uneven.

Subsequently, a pixel defining layer 64 is formed on the first electrode 61. A plurality of pixel openings corresponding to the plurality of first electrodes 61 are provided on the pixel defining layer 64, and each pixel opening exposes a part of the corresponding first electrode 61.

Subsequently, an organic light emitting material 62 is formed. The organic light emitting material 62 is at least partially located in the pixel opening, and the portion of the organic light emitting material 62 located in the pixel opening is uneven.

Subsequently, a second electrode 63 is formed, and the second electrode 63 covers the organic light emitting material 62 and the exposed pixel defining layer 64. The portion of the second electrode 63 located in the pixel opening is uneven.

In some examples, the first electrode 61, the organic light emitting material 62, and the second electrode 63 can be produced by a physical vapor deposition process. However, other processes such as an evaporation process can also be used to produce the first electrode 61, the organic light emitting material 62, and the second electrode 63.

In one example, the first electrode 61 is a reflective electrode, and the second electrode 63 is a light transmitting electrode. That is, the display panel has a top emission structure.

In other examples, the first electrode 61 is a light transmitting electrode, and the second electrode 63 is a reflective electrode. That is, the display panel has a bottom emission structure.

In some examples, the first electrode is an anode and the second electrode is a cathode. The first electrode is a block-shaped electrode, and the second electrode can be a whole-surface electrode.

In one example, after step 160, the manufacturing method for a display panel further includes: forming an encapsulation layer on the side of the pixel structure facing away from the substrate. The encapsulation layer can be a thin film encapsulation layer.

Referring to FIG. 8, which is a schematic structural diagram of a display panel provided by an exemplary embodiment of the present application. The display panel includes: a substrate 10; a driver circuit layer 20 (including structures 21-25) over the substrate; a planarization layer 30 on the side of the driver circuit 20 facing away from the substrate 10; an auxiliary structure layer 50 on the side of the planarization layer 30 facing away from the substrate 10, the auxiliary structure layer 50 having a plurality of protrusion structures 51 on the side of the auxiliary structure layer 50 facing away from the substrate 10; and a pixel structure 60 on the side of the auxiliary structure layer 50 facing away from the substrate 10, the auxiliary structure layer 50 making the pixel structure 60 uneven, and the pixel structure 60 including a first electrode 61, an organic light emitting material 62, and a second electrode 63 that are sequentially formed on the side of the auxiliary structure layer 50 facing away from the substrate 10.

In one example, the auxiliary structure layer 50 is formed by polymerizing polymer monomers to form a plurality of microsphere structures, then filling the gaps among the microsphere structures with liquid crystal phase molecules to form protrusion structures, and finally removing the liquid crystal phase molecules.

In one example, the material of the auxiliary structure layer 50 is at least one of an olefin monomer and a mercaptan monomer or at least one of an epoxy monomer and a thiol monomer.

In one example, the auxiliary structure layer 50 includes a plurality of microsphere structures, and the plurality of microsphere structures are gathered together to form at least one microsphere aggregation layer, and the exposed part of the uppermost microsphere aggregation layer forms the plurality of protrusion structures 51.

In one example, a size of the microsphere structure 52 ranges from 100 nm to 2000 nm.

In one example, the protrusion structure 51 has a hemispherical shape.

In one example, the maximum thickness of the protrusion structures 51 ranges from 20 nm to 400 nm.

Figure 9:
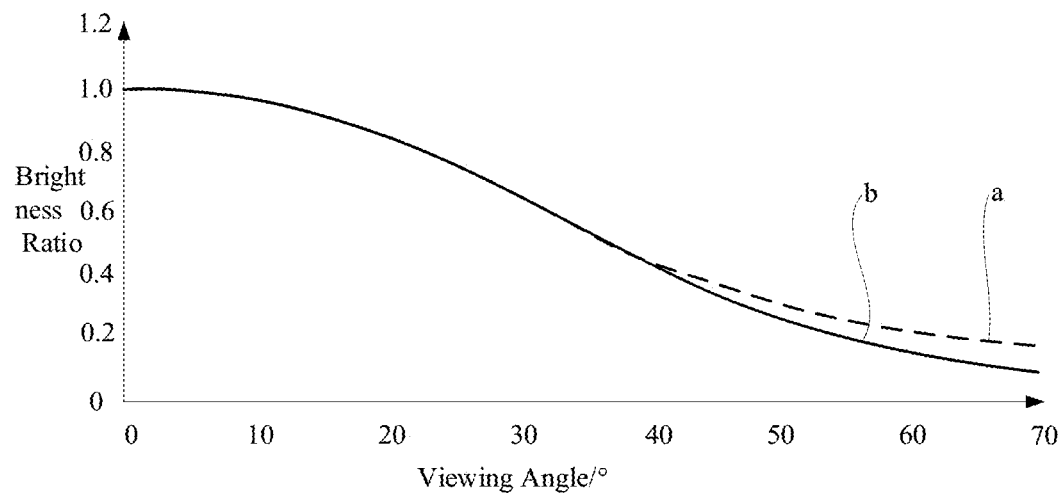
FIG. 9 is a comparison graph of white light brightness attenuation curves of a display panel produced by the manufacturing method provided in the embodiment of the present application and the existing display panel.
Figure 10:
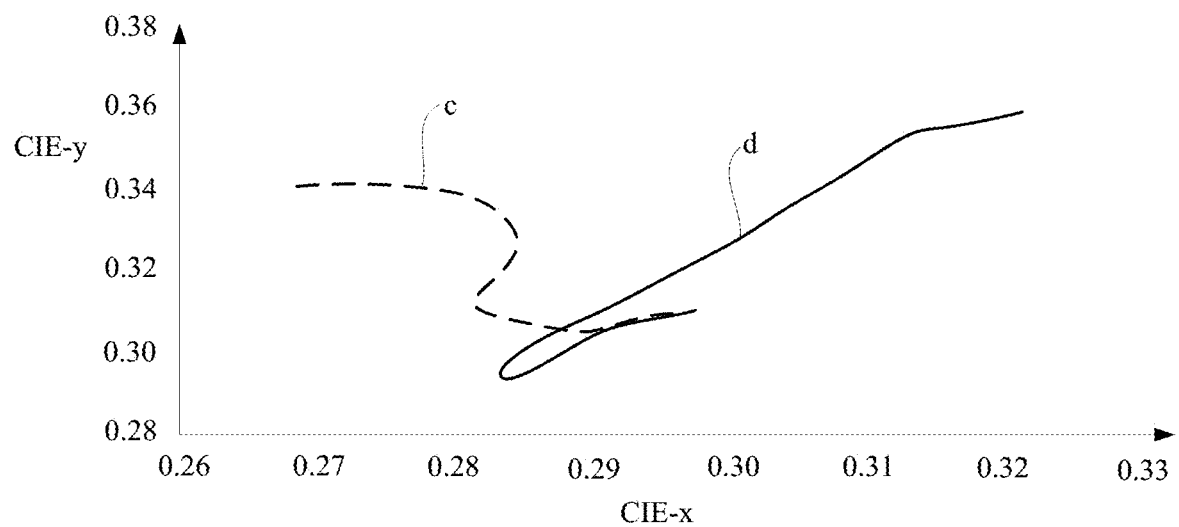
FIG. 10 is a comparison graph of white light chromaticity curves between the display panel produced by the manufacturing method provided in the embodiment of the present application and the existing display panel.

The display panel produced by the manufacturing method provided in the embodiment of the present application and the existing display panel (the film layer of the pixel structure is not provided with an uneven structure) were optically tested respectively, and the obtained results are shown in FIG. 9 and FIG. 10.

FIG. 9 is a graph of brightness attenuation curves of the white light of the two display panels obtained by the test, and the ordinate is the brightness ratio, which represents the ratio of the actual brightness to the brightness when the viewing angle is zero degrees. The curve a represents the brightness attenuation curve of the white light of the display panel produced by the manufacturing method provided in the embodiment of the present application, and the curve b represents the brightness attenuation curve of the white light of the existing display panel. It can be seen from FIG. 9 that the brightness decay of the display panel produced by the manufacturing method provided in the embodiment of the present application is relatively slow.

FIG. 10 is a graph of white light chromaticity curves of two display panels obtained by the test, the abscissa is CIE-x, and the ordinate is CIE-y. The curve c represents the white light chromaticity curve of the display panel produced by the manufacturing method provided in the embodiment of the present application, and the curve d represents the white light chromaticity curve of the existing display panel. It can be seen from FIG. 10 that the color shifts problem of the display panel obtained by the manufacturing method provided in the embodiment of the present application has been alleviated.

The embodiment of the present application also provides a display device. The display device includes a display panel produced by the manufacturing method described in any of the foregoing embodiments.

The display device can further include a housing, and the display panel is embedded in the housing.

The display device provided in the embodiment of the present application can be, for example, any device with a display function, such as a mobile phone, a tablet computer, a television, a notebook computer, and a vehicle-mounted device.

As for the method embodiment, since it basically corresponds to the product embodiment, for the description of related details and beneficial effects, reference can be made to the part of the description of the product embodiment, which will not be repeated herein.

It should be pointed out that in the drawings, the sizes of layers and regions can be exaggerated for clarity of illustration. It will also be understood that when an element or layer is referred to as being "on" another element or layer, it can be directly on the other element or intervening layers can be present. In addition, it will be understood that when an element or layer is referred to as being "under" another element or layer, it can be directly under the other element, or there can be more than one intervening layer or element. In addition, it can also be understood that when a layer or element is referred to as being "between" two layers or two elements, it can be the only layer between the two layers or two elements, or more than one intervening layer or element can also be present. Similar reference numerals indicate similar elements throughout.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

What is claimed is:

1. A manufacturing method for a display panel, comprising:
   providing a substrate;
   forming a driving circuit layer on the substrate;

forming a planarization layer on the side of the driving circuit layer facing away from the substrate;

forming a composite material layer on the side of the planarization layer facing away from the substrate with a polymerization-induced phase separation method to the composite material layer comprising a polymer and liquid crystal phase molecules dispersed in the polymer;

removing the liquid crystal phase molecules in the composite material layer to obtain an auxiliary structure layer, the side of the auxiliary structure layer facing away from the substrate having a plurality of protrusion structures; and forming a pixel structure on the side of the auxiliary structure layer facing away from the substrate, wherein the auxiliary structure layer makes the pixel structure uneven, and the pixel structure comprises a first electrode, an organic light emitting material, and a second electrode that are sequentially formed on the side of the auxiliary structure layer facing away from the substrate.

2. The manufacturing method for a display panel of claim 1, wherein forming a composite material layer on the side of the planarization layer facing away from the substrate with a polymerization-induced phase separation method comprises:

coating a mixture of liquid crystal phase molecules and polymer monomers on the planarization layer; and initiating a polymerization reaction of the polymer monomers, to generate a plurality of microsphere structures of a material of polymer, wherein the liquid crystal phase molecules are dispersed in gaps among the microsphere structures to obtain the composite material layer including the plurality of microsphere structures and the liquid crystal phase molecules.

3. The manufacturing method for a display panel of claim 2, wherein the polymer monomers are ultraviolet polymer monomers, and initiating a polymerization reaction of the polymer monomers, to generate a plurality of microsphere structures of a material of polymer comprises:

irradiating the mixture with ultraviolet light to polymerize the ultraviolet polymer monomers to form a plurality of microsphere structures.

4. The manufacturing method for a display panel of claim 2, wherein the polymer monomers are thermally polymer monomers, and initiating a polymerization reaction of the polymer monomers, to generate a plurality of microsphere structures of a material of polymer comprises:

heating the mixture to polymerize the thermally polymer monomers to form a plurality of microsphere structures.

5. The manufacturing method for a display panel of claim 2, wherein in the mixture of the liquid crystal phase molecules and the polymer monomers, a mass fraction of the liquid crystal phase molecules is in the range of 50%~80%.

6. The manufacturing method for a display panel of claim 1, wherein the auxiliary structure layer comprises a plurality of microsphere structures, and a size of the microsphere structure ranges from 100 nm to 2000 nm.

7. The manufacturing method for a display panel of claim 1, wherein in the auxiliary structure layer, the maximum thickness of the protrusion structure ranges from 20 nm to 400 nm.

8. The manufacturing method for a display panel of claim 1, wherein the liquid crystal phase molecules are liquid crystal molecules.

9. The manufacturing method for a display panel of claim 1, wherein the liquid crystal phase molecules are made of organic material, and removing the liquid crystal phase molecules in the composite material layer comprises:

immersing the composite material layer in an organic solvent, or spraying the composite material layer with an organic solvent, so that the liquid crystal phase molecules are dissolved in the organic solvent.

10. The manufacturing method for a display panel of claim 1, wherein the first electrode is a reflective electrode, and the second electrode is a light transmitting electrode; or, the first electrode is a light transmitting electrode, and the second electrode is a reflective electrode.

11. A display panel manufactured by the method of claim 1 comprising:

a substrate;

a driver circuit layer over the substrate-e;

a planarization layer on the side of the driver circuit facing away from the substrate;

an auxiliary structure layer on the side of the planarization layer facing away from the substrate, the auxiliary structure layer having a plurality of protrusion structures on the side of the auxiliary structure layer facing away from the substrate; and a pixel structure on the side of the auxiliary structure layer facing away from the substrate, wherein the auxiliary structure layer makes the pixel structure uneven, and the pixel structure comprises a first electrode, an organic light emitting material, and a second electrode that are sequentially formed on the side of the auxiliary structure layer facing away from the substrate.

12. The display panel of claim 11, wherein the auxiliary structure layer is formed by polymerizing polymer monomers to form a plurality of microsphere structures, filling the gaps among the microsphere structures with liquid crystal phase molecules to form protrusion structures, and finally removing the liquid crystal phase molecules.

13. The display panel of claim 11, wherein the material of the auxiliary structure layer is at least one of an olefin monomer and a mercaptan monomer or at least one of an epoxy monomer and a thiol monomer.

14. The display panel of claim 11, wherein the auxiliary structure layer comprises a plurality of microsphere structures, and the plurality of microsphere structures are gathered together to form at least one microsphere aggregation layer, and the exposed part of the uppermost microsphere aggregation layer forms the plurality of protrusion structures.

15. The display panel of claim 11, wherein the size of the microsphere structure ranges from 100 nm to 2000 nm.

16. The display panel of claim 11, wherein the protrusion structure is hemispherical.

17. The display panel of claim 11, wherein the maximum thickness of the protrusion structures ranges from 20 nm to 400 nm.

18. A display device comprising:

a display panel of claim 11; and a housing, wherein the display panel is embedded in the housing.

* * * * *